United States Patent
Nam et al.

(10) Patent No.: US 11,081,489 B2
(45) Date of Patent: Aug. 3, 2021

(54) SEMICONDUCTOR STRUCTURE AND METHOD FOR FABRICATING THE SAME

(71) Applicant: XIA TAI XIN SEMICONDUCTOR (QING DAO) LTD., Qingdao (CN)

(72) Inventors: Chang-Hyeon Nam, Singapore (SG); Injoon Yeo, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/679,348

(22) Filed: Nov. 11, 2019

(65) Prior Publication Data

US 2021/0143157 A1    May 13, 2021

(51) Int. Cl.
*H01L 27/108* (2006.01)

(52) U.S. Cl.
CPC .. *H01L 27/10885* (2013.01); *H01L 27/10814* (2013.01); *H01L 27/10823* (2013.01); *H01L 27/10894* (2013.01); *H01L 27/10897* (2013.01)

(58) Field of Classification Search
CPC ......... H01L 27/10885; H01L 27/10823; H01L 27/10814; H01L 27/10897
See application file for complete search history.

(56) References Cited

U.S. PATENT DOCUMENTS

| | | | | |
|---|---|---|---|---|
| 2004/0084709 A1* | 5/2004 | Kim | ........................ | H01L 28/60 257/306 |
| 2006/0284225 A1* | 12/2006 | Popp | .................. | H01L 21/26586 257/296 |
| 2007/0020844 A1* | 1/2007 | Chen | .................. | H01L 27/10888 438/253 |
| 2007/0026680 A1* | 2/2007 | Hong | ................. | H01L 27/10885 438/700 |
| 2015/0214313 A1* | 7/2015 | Oh | ....................... | H01L 29/4236 257/2 |
| 2017/0025420 A1* | 1/2017 | Park | .................. | H01L 27/10852 |
| 2017/0069726 A1* | 3/2017 | Kye | .................. | H01L 27/10894 |

* cited by examiner

*Primary Examiner* — David A Zarneke
(74) *Attorney, Agent, or Firm* — ScienBiziP, P.C.

(57) ABSTRACT

A semiconductor structure is disclosed, which comprises a substrate, a bit line (BL) stack feature and a BL spacer. The substrate has a cell area and a periphery area defined thereon. The bit line stack feature formed over an active region in the cell area, comprises a buffer liner having a U-shaped profile that opens upwardly in a cross section thereof and defining an inner surface, a BL conductor disposed in the U-shaped profile on the inner surface, and a capping layer over the BL conductor. The BL spacer covers sidewall surfaces of the BL stack feature.

11 Claims, 15 Drawing Sheets

SEMICONDUCTOR STRUCTURE AND METHOD FOR FABRICATING THE SAME

FIELD

The present disclosure generally relates to semiconductor structure, more specifically to a semiconductor structure that includes bit lines.

BACKGROUND

Modern integrated circuits (IC) are designed to encompass millions of components such as transistors, capacitors, resistors with high device density. The demand for higher degree of horizontal integration requires a reduction in the dimensions (or feature size) of the integrated circuit components, for instance, the reduction of lateral width in bit line structures in, e.g., a memory device.

However, a reduction in minimal widths of features such as bit lines may sacrifice certain electrical properties, and as a result, adverse effects may occur to impact the performance of the integrated circuits. Accordingly, there is a need for improvements to the design of the bit lines.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
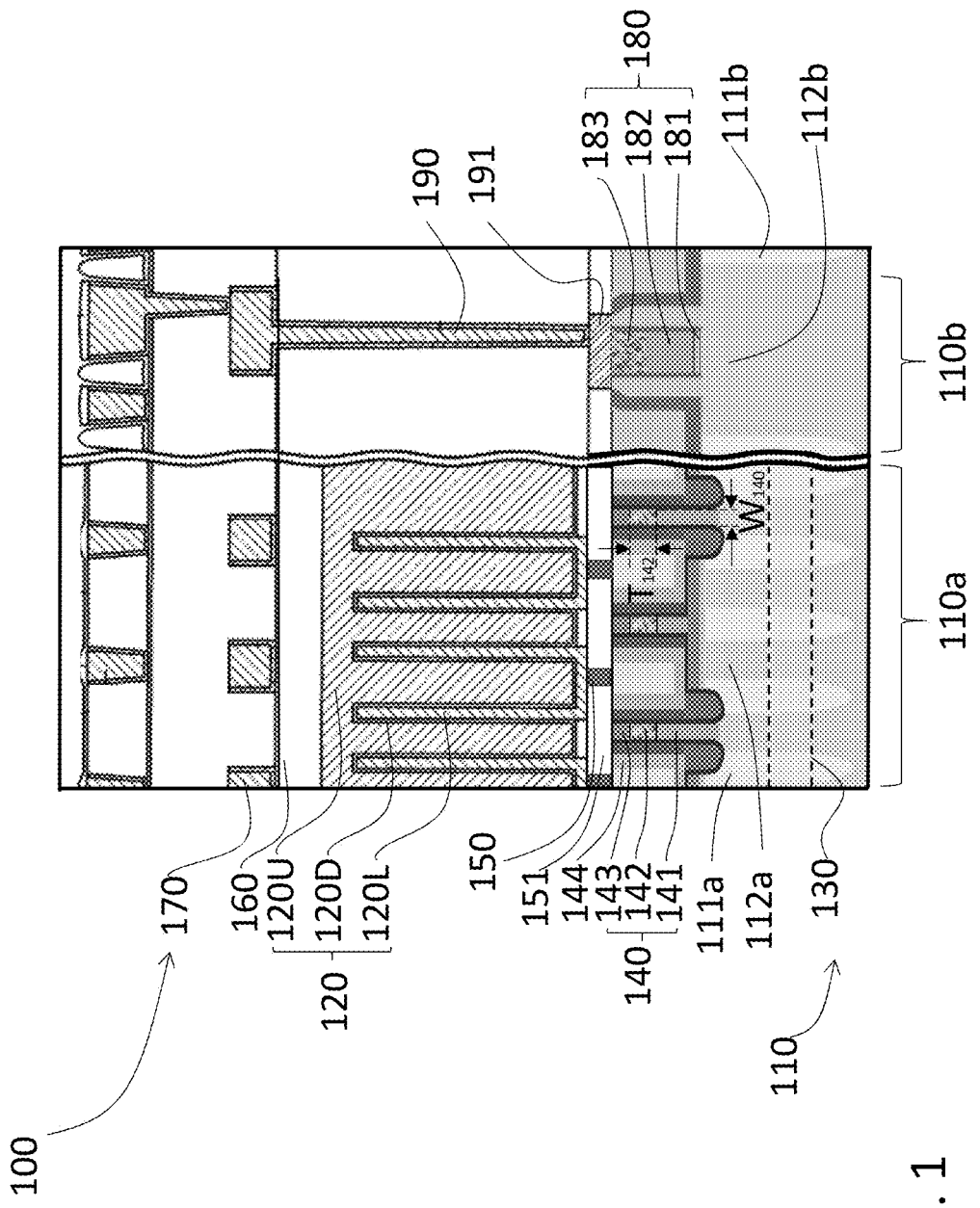
FIG. 1 illustrates a cross-sectional view of an exemplary semiconductor device in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 3. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates a regional cross-sectional view of a semiconductor device 100 in accordance with the instant disclosure. For illustrational simplicity and clarity, some detail/sub components of the exemplary device are not explicitly labeled in the instant figure.

The exemplary semiconductor device 100 comprises a semiconductor substrate 110 and multiple layers of integrated circuit devices and features formed on the substrate 110. Several functional regions may be arranged laterally (e.g., horizontally across the page as shown in FIG. 1) over the substrate 110. By way of example, FIG. 1 shows a substrate of an exemplary device that includes two co-planar arranged functional regions defined thereon, e.g., a cell region 110a and a periphery region 110b.

The substrate 110 may comprise a crystalline silicon substrate. The substrate may comprise various doped regions depending on design requirements (e.g., p-type substrate or n-type substrate). The doped regions may be doped with p-type dopant, such as boron or BF2; n-type dopant, such as phosphorus or arsenic; and/or combinations thereof. In some alternative embodiments, the substrate 110 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epilayer) and/or may include a silicon-on-insulator (SOI) structure, such as a silicon-on-insulator (SOI) structure, SiGe-on insulator (SiGeOI), Ge on insulator (GeOI) and the like.

The periphery region 110b may comprise various active device regions 112b laterally separated by isolation features, such as shallow trench isolation (STI) 111b. The active region 112b may comprise an active circuit component (i.e., a gate structure 180) that make up the periphery support circuits, e.g., read-out, decoder, or amplifier circuits that controlling memory cells formed in the cell region. Over the active region there may be one or more upper inter device layers, through which contact via 190 may be provided to enable vertical signal conduction (e.g., from the gate structure 180) to a higher device layer. The contact via 190 may be connected to a corresponding contact pad 191 in a fashion similar to that in the cell region 110a. The gate structure 180 may including a gate dielectric 181 on an active region, a gate material 182 on the gate dielectric 181, and a conductive material 183 on the gate material 182. The conductive material 183 may include tungsten.

The cell region 110a may comprise various active device regions 112a laterally separated by isolation features, such as STI 111b.

In the illustrated embodiment, array of memory unit cells may be formed in the cell region 110a of the substrate 110. Each of the memory cell units typically includes a storage element (such as capacitor 120) and a selection device (not shown) such as a transistor.

In the exemplary embodiment, a capacitor 120 includes a lower electrode 120L, a capacitor dielectric 120D lining on the lower electrode 120L, and an upper electrode 120U filling the gaps between the lower electrodes 120L.

In some embodiments, the lower electrode 120L may be a cylindrical or pillar-shaped conductive structure having high aspect ratio (i.e., high depth to width ratio), which corresponds to a tall upward opening U-shaped cross sectional profile (as shown the instant example). The lower electrode 120L may be formed from a conformal conductive film made of one or more conductive material(s) such as BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$).

The capacitor dielectric 120D may be a conformally formed layer that comprises a nitride, an oxide, a metal oxide, or a combination thereof. For example, the capacitor dielectric 120D may include a single or a multilayered film formed from silicon nitride, silicon oxide, a metal oxide (e.g., HfO$_2$, ZrO$_2$, Al$_2$O$_3$, La$_2$O$_3$, Ta$_2$O$_3$, and TiO$_2$), a perovskite dielectric material (e.g., STO (SrTiO$_3$), BST ((Ba,Sr)TiO$_3$), BaTiO$_3$, PZT, and PLZT, or a combination thereof. In some embodiments, high-K dielectric material may be applied to boost capacitor performance, e.g., enhance capacitance for a given electrode surface area.

The upper electrode 120U may be formed of one or more conductive material such as doped semiconductor, conductive metal nitride, metal, metal silicide, conductive oxide, or a combination thereof. For instance, the upper electrode 120U may be formed of conducive material(s) including BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$), though the list of suitable material is merely exemplary and not exhaustive.

A storage node contact (not labeled) establishes a vertical conductive path connecting the lower electrodes 120L of the capacitors 120 and top surface of active region 112a of the substrate 110 under the lower electrodes 120L. In some embodiments, the lower electrodes 120L may not be in direct contact with the storage node contacts. For example, if the capacitors 120 are not projectively aligned with the storage node contacts, a landing pad 150 may be additionally formed to connect the lower electrode 120L electrically to the storage node contact. In addition, a landing pad insulating layer 151 may be further formed to electrically separate the landing pads 150 from each other.

In the illustrated embodiment, a interlayer insulating layer 160 is formed to cover capacitors (e.g., capacitors 120) over the cell region 110a. Additional conductive features, such as upper metallization feature 170 and additional inter metal dielectric layers may be formed over the interlayer insulating layer 160 and the upper electrode 120U to enable interconnection between circuit elements.

A buried channel array transistor (BCAT) may include a word line 130 that is part of a memory cell selection device. A pair of BCATs whose respective source/drain (S/D) regions connect to a contact plug not specifically labeled. A contact plug enables electrical connection between the selection transistor (e.g., BCAT) to a lower electrode (e.g., 120L) of a storage capacitor 120 (e.g., through a pad not specifically labeled). The gate features of an exemplary buried type device may comprise a recess-filling structure (in a cross sectional profile) buried in a gate trench in the active region of the substrate. In practical applications, the word line 130 may be a longitudinally traversing linear structure (e.g., extending horizontally in the page of, e.g., FIG. 1) that intercepts multiple adjacent active regions.

In the illustrated embodiment, several bit line (BL) stack features 140 are formed over the cell region 110a. In practical applications, the BL stack features 140 may be a laterally traversing linear structure (e.g., extending in/out of the page of, e.g., FIG. 1) that projectively intercepts multiple word lines (e.g., word lines 130). Each of the BL stack features 140 comprises a BL contact 141, a BL conductor 142, and a BL mask pattern 143. The BL conductor 142 is part of a memory cell selection device that electronically connect to an active region that serve as a source of the selection device through the BL contact 141. The BL contact 141 may be made of conductive material such as poly silicon oxide. The BL conductor 142 may include conductive material such as tungsten.

In the embodiment illustrated in FIG. 1, the semiconductor device 100 may be a Dynamic Random Access Memory (DRAM) device.

In the quest to pursuit the ever-shrinking device form factor, it is found that over-minimization of feature dimensions of a semiconductor device may hinder device performance.

By ways of example, as the BL stack features 140 is designed to be narrower (i.e., with a smaller width Wm), a cross section area of the BL conductor 142 may be reduced. On the other hand, the conductance quality of the BL conductor 142 is substantially proportional to a cross-sectional area thereof. As a result, the resistance of the narrowed BL conductor 142 may increase such that the device performance is adversely affected.

To reduce such impact, in some scenarios, a thickness (e.g., thickness $T_{142}$) of the narrowed BL conductor 142 in vertical direction may be increased in order to compensate the loss of the cross-sectional area thereof resulting from the reduction of the width $W_{140}$. Consequently, a thickness of the BL stack features 140 along the vertical direction is increased. As an undesirable result, the narrowed BL stack features 140 may reach a height that is prone to leaning in the subsequent processes (such as the formation process of spacer 144 that laterally covers the BL stack feature 140).

To avoid the leaning problems, the thickness $T_{142}$ of the BL conductor 142 may be lower than an upper limit. Accordingly, mindful consideration would be required in the design of BL thickness $T_{142}$ in the hope to meet the demand of maintaining the device performance.

In addition, the upper limit of the thickness $T_{142}$ of the BL conductors 142 may be further reduced due to the thickness of the BL capping 143. By ways of example, a first step of an exemplary fabricating process of the BL stack features 140 is to sequentially dispose a BL contact layer, a tungsten layer, and a mask layer on the substrate 110. The mask layer may be subsequently patterned to form the BL capping 143. Afterwards, etching processes may be performed through the BL capping 143 such that exposed portions the tungsten layer and the BL contact layer are recessed. The remained portions of the BL capping 143 under the BL capping 143 may define the BL stack features 140. In some scenarios, the thickness of the BL capping 143 may be great enough to withstand the etching gas during the etching process, especially the gas for etching the tungsten layer. Considering the thickness of the BL capping 143 and the leaning problem of the BL stack features 140, the upper limit of the thickness $T_{142}$ of the BL conductors 142 may be even smaller. Meanwhile, the design choice regarding a reduction of the width $W_{140}$ of the tungsten BL conductors 142 may be further limited.

Figure 2:
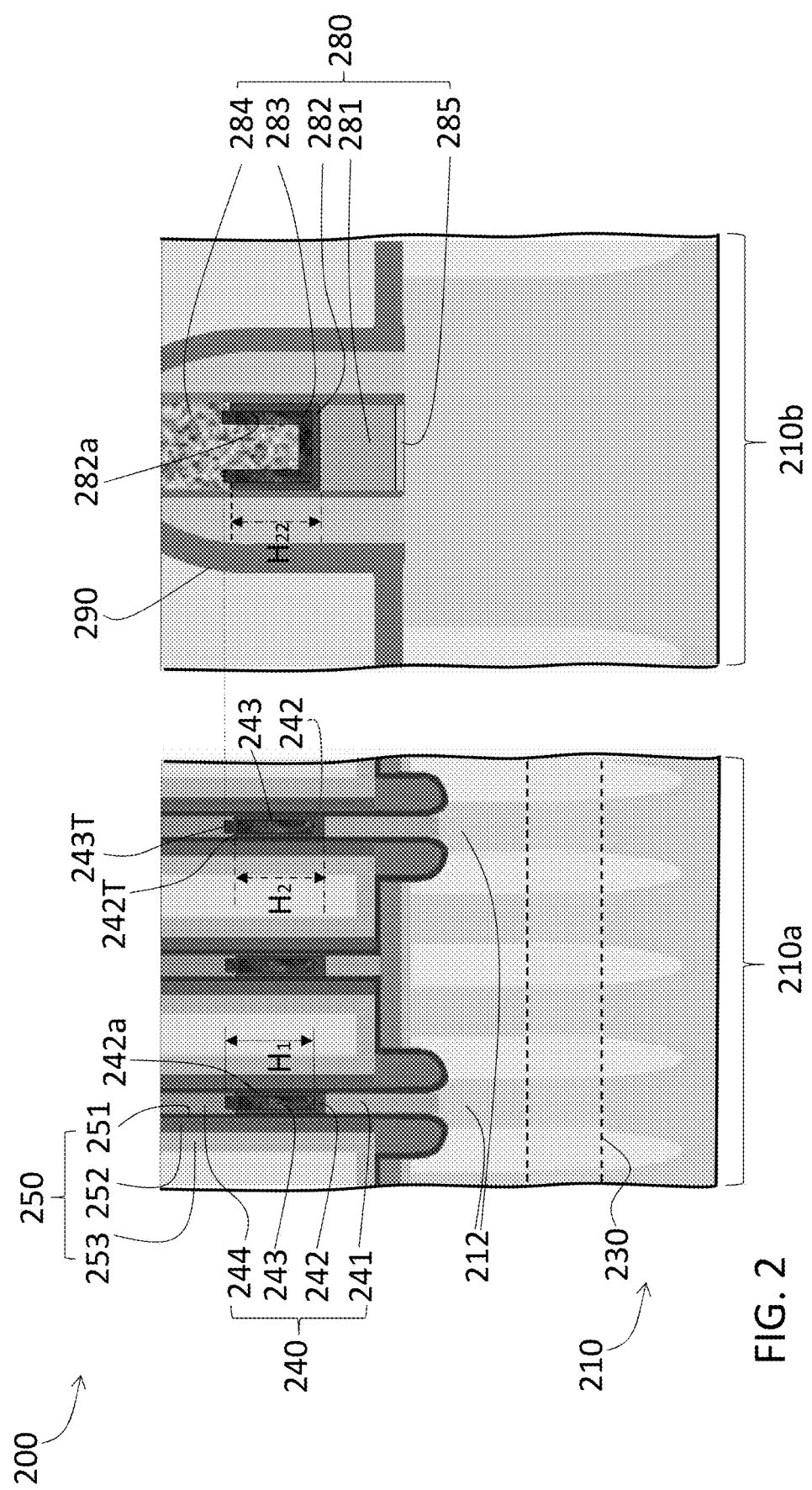
FIG. 2 illustrates a cross-sectional view of an exemplary semiconductor structure in accordance with some embodiments of the instant disclosure.

FIG. 2 illustrates a regional cross-sectional view of a semiconductor structure 200 in accordance with the instant disclosure.

In some embodiments, the semiconductor structure 200 may serve as part of a memory device. By ways of example, multiple device layers may sequentially formed over top surface of the exemplary semiconductor structure 200. Several components such as landing pads (e.g., landing pad 150), capacitors (e.g., capacitors 120), upper metal lines (e.g., upper metal lines 170), and via (e.g., via 190) may formed in the multi device layers.

In the illustrated embodiment, a substrate 210 includes a cell area 210a and a periphery area 210b defined thereon. The details of the substrate 210 may be similar to that of the substrate 110 illustrated in FIG. 1.

As shown in FIG. 2, several BL stack features 240 are formed over respective active regions 212 in the cell area 210a. The BL stack features 240 may be a laterally traversing linear structure (e.g., extending in/out of the page of, e.g., FIG. 2) that projectively intercepts multiple word lines 230. Both sidewall surfaces of each of the BL stack features 240 are covered by BL spacer 250. In the illustrated example, the BL spacer 250 includes multiple layers such as an inner layer 251 that may comprise silicon nitride, a middle layer 252 that may comprise silicon oxide, and an outer layer 253 that may comprise silicon nitride.

The BL stack feature 240 comprises a BL contact 241 on the substrate 210, a buffer liner 242 on the BL contact 241, a BL conductor 243 on the buffer liner 242, and a capping layer 244 on the BL conductor 243.

The BL contact 241 may be formed of conductive material such as poly silicon.

The buffer liner 242 has a U-shaped profile that opens upwardly in a cross section thereof and defining an inner surface 242a. The buffer liner 242 may be formed via performing a CVD deposition. The buffer liner 242 selectively comprises Ti, TiN and TSN. A thickness of the buffer liner 242 is about 10 Å.

The BL conductor 243 is disposed in the U-shaped profile on the inner surface 242a. In the illustrated example, the BL conductor 243 has a top surface 243T at a level higher than a top edge 242T of the buffer liner 242. In some embodiments, top surface 242T of the buffer liner 242 may be covered by the BL contact 241. The BL conductors 243 may comprise materials that deposit at a faster rate on the buffer liner 242 (i.e., a layer comprising Ti, TiN, TSN or a combination thereof) than that on the spacers 250 (i.e., a layer comprising silicon nitride, silicon oxide or a combination thereof). That is, the BL conductors 243 may be formed via performing a selective deposition process. In some embodiments, the BL conductor 243 may selectively comprises ruthenium (Ru) and cobalt (Co).

In some embodiments, the disposition of the BL conductors 243 may comprise cyclically performing an atomic layer deposition (ALD) process and an atomic layer etching (ALE) process. During the ALD process, material that selectively comprises Ru and Co is may be primarily deposited on the buffer liner 242; the ALE process allows the removal of individual atomic layers of the material that are deposited on the spacers 250.

Under identical cross-sectional area conditions, Ru or Co possesses smaller resistance than tungsten (W). In the other words, the BL conductor 243 made of material selectively comprise Ru and Co may achieve comparable conductive property as that of a tungsten BL conductor (e.g., BL conductor 142 illustrated in FIG. 1) with smaller cross-sectional area. As such, the BL conductor 243 may be formed narrower without an enlargement on the thickness $H_1$ that causes leaning problem. In some embodiments, the area of the cross section of the BL conductor 243 is in a range from about 75 to 1750 nm$^2$. In such embodiments, a width of a BL conductor made of Ru can be designed to be in a range from about 5 to 25 nm, which is narrower than a tungsten BL conductor. In addition, the thickness $H_1$ of the BL conductor 243 may be in a range from about 15 to 70 nm.

In some embodiments, a inter-feature thickness variation between the Ru/Co BL conductors (e.g., BL conductors 243) is in a range from about 1 to 5%.

In the illustrated example, a gate stack feature 280 is formed over the periphery area 210b. In the illustrate example, the BL stack feature 240 is narrower than the gate stack feature 280. A gate spacer 290 is formed to cover sidewall surfaces of the gate stack feature 280.

In the exemplary gate stack 280, a gate conductor 281 may be formed on a gate dielectric 285. The gate layer 281 may be formed of conductive material comprising poly silicon. In some embodiments, the gate conductor 281 and the BL contact 241 may be formed in a same process.

In the illustrated embodiment, a buffer liner 282 is formed on the gate conductor 281. The buffer liner 282 has a U-shaped cross-sectional profile that opens upwardly in a cross section thereof and defines an inner surface 282a. The buffer liner 282 may selectively include Ti, TiN, and TSN. In the illustrated embodiment, the buffer liner 282 and the buffer liner 242 may be formed in a same deposition process. Accordingly, a height $H_{22}$ of the buffer liner 282 of the gate stack feature 280 may be substantially equal to a height $H_2$ of the buffer liner 242 of the BL stack feature 240. In addition, the buffer liner 282 of the gate stack feature 280 may include identical material as that of the buffer liner 242 of the BL stack feature 240.

A conductive liner 283 is disposed in the U-shaped profile on the inner surface 282a of the buffer liner 282a. The conductive liner 283 may include Ru, Co, or a combination thereof. In the illustrated embodiments, the conductive liner 283 and the BL conductor 243 may be formed in a same fabrication process. Accordingly, the BL conductor 243 may have a top surface 243T substantially at an identical level as that of the conductive liner 283. In addition, the conductive liner 283 of the gate stack feature 280 may include identical material(s) as that of the BL conductors 233.

FIGS. 3A-3M show exemplary fabrication processes of a semiconductor device in accordance with some embodiments of the instant disclosure.

Figure 3A:
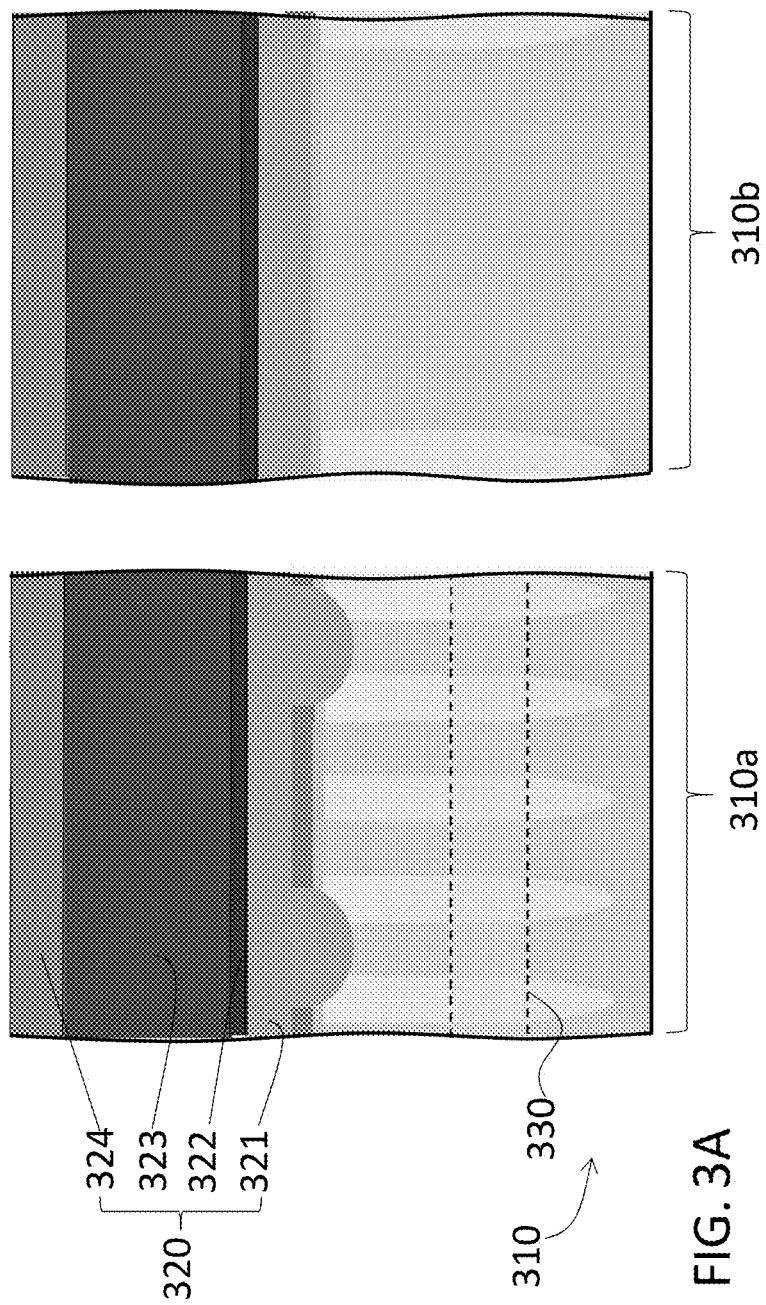
FIG. 3A-3M illustrate an exemplary fabricating process of a semiconductor structure in accordance with some embodiments.

FIG. 3A illustrates a stage of an exemplary fabricating process of a semiconductor structure in accordance with some embodiments. For example, FIG. 3A shows that a layer stack 320 are formed over a substrate 310 that has a cell area 310a and a periphery area 310b defined thereon. The formation process for the layer stack 320 may include sequentially forming a conductive layer 321 over the substrate 310, a buffer layer 322, a first dummy layer 323, and a mask layer 324 over the two function regions 310a, 310b of the substrate 310.

In some embodiments, the conductive layer 321 may comprise poly silicon.

In some embodiments, the buffer layer 322 may comprise silicon oxide.

The first dummy layer 323 is formed at an upper portion of the layer stack 320.

In some embodiments, the first dummy layer 323 may comprise poly silicon.

The mask layer 324 is formed at a top portion of the layer stack 320. In some embodiments, the mask layer 324 may comprise silicon nitride.

Figure 3B:
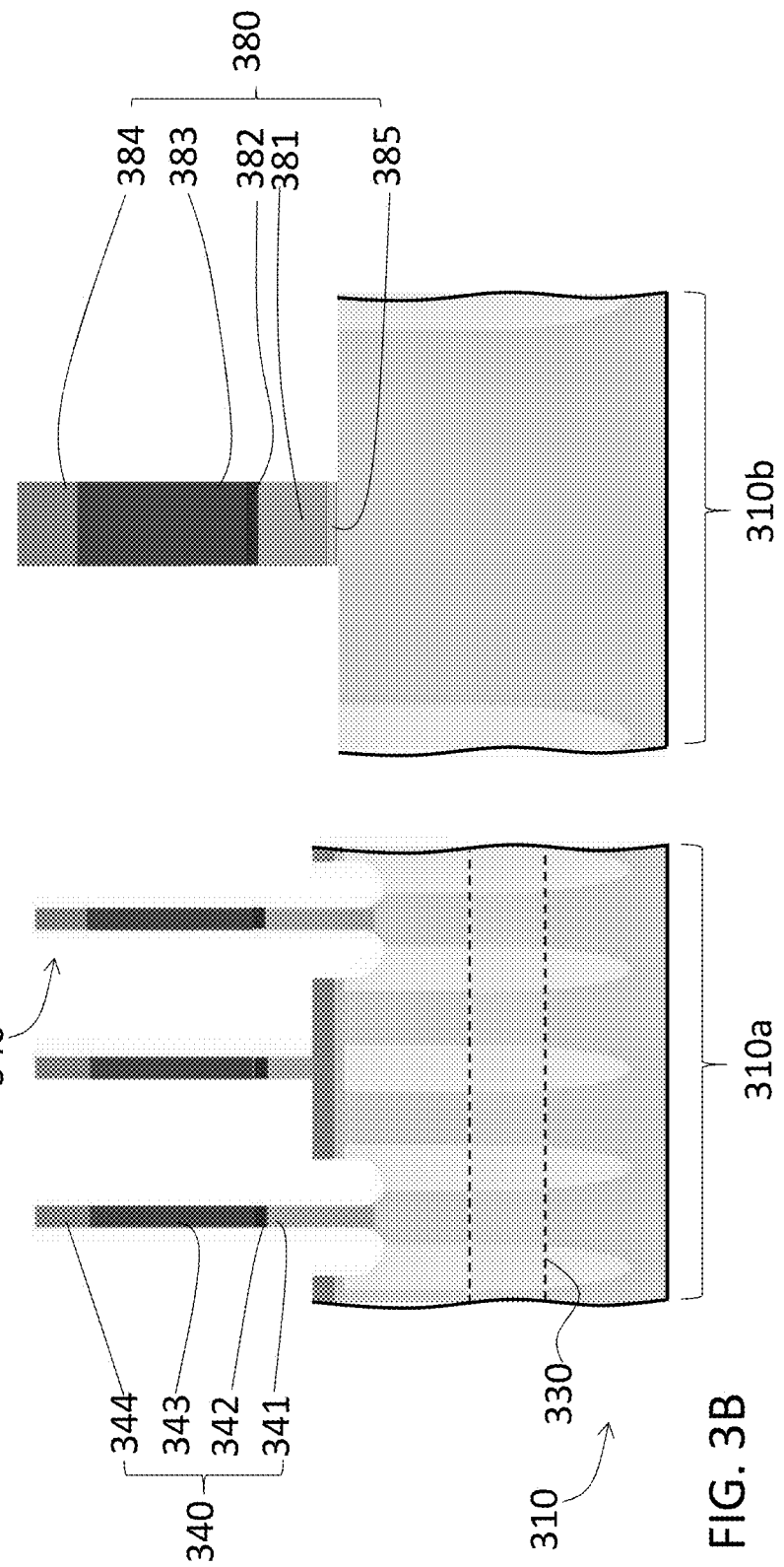

FIG. 3B illustrates a stage of an exemplary fabricating process of a semiconductor structure in accordance with some embodiments. In particular, FIG. 3B shows that the layer stack 320 is patterned to form several first stack features 340 (also referred as to a stack feature 340) over the cell area 310a and a second stack feature 380 over the periphery area 310b. In the illustrated example, the first stack feature 340 is patterned to have narrower lateral width than the second stack feature 380. The formation of the stack features 340, 380 may comprise forming photoresist patterns over the mask layer 324, and then recessing the conductive layer 321, the buffer layer 322, and the first dummy layer 323 through the mask patterns 344, 384. In the illustrated embodiment, the first stack feature 340 comprises a BL contact 341 that establishes electrical connection with the substrate 310, a buffer portion 342 above the BL contact 341, a first dummy portion 343 (may also referred as to first dummy layer 343) above the buffer portion 342, and a mask patterns 344 on the first dummy portion 343. In the illustrated embodiment, the first dummy layer 323 may has a thickness about 1200 Å.

It is worth mentioning that the mask patterns 344 and 384 don't need to withstand process gas that etches a tungsten layer to form BL contact 142 as shown in FIG. 1. Accordingly, a thickness of mask patterns 344, 384 may be relatively smaller than that of the BL capping 143 of the embodiment illustrated in FIG. 1. As a desirable result, the stack features 340, 380 are shorter and less likely to lean in the sequent processes.

Figure 3C:
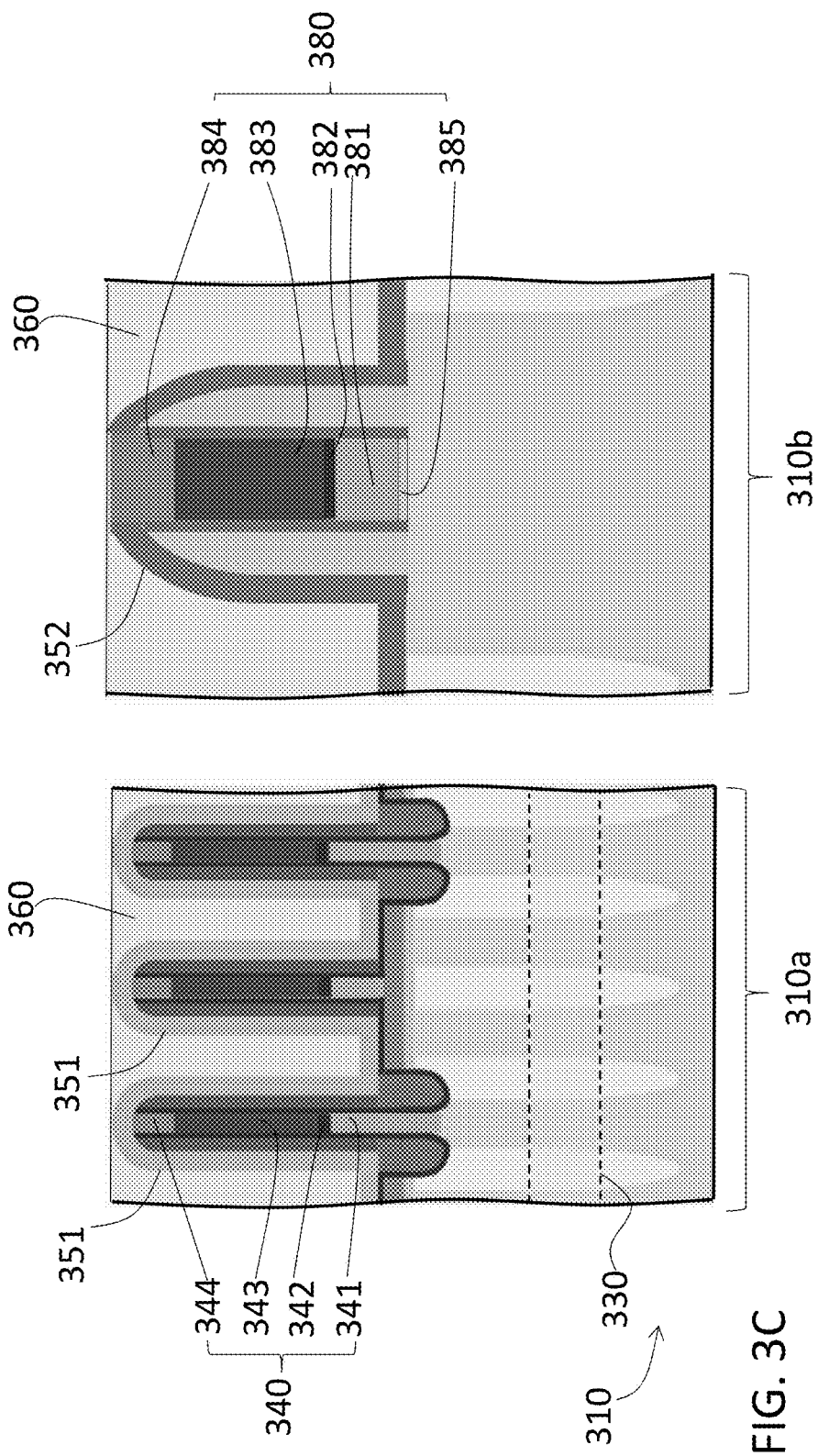

FIG. 3C illustrates a stage of an exemplary fabricating process of a semiconductor structure in accordance with some embodiments. In particular, FIG. 3C shows a plurality of first spacers 351 (also referred as to spacers 351) being formed to respectively cover both sidewall surfaces of the first stack features 340. In addition, a second spacer 352 is formed to cover sidewall surfaces of second stack feature 380. In the illustrated example, the disposing of the first spacers 351 may include sequentially depositing an inner layer 351a that comprise silicon nitride, a middle layer 351b that may comprise silicon oxide, and an outer layer 351c that may comprise silicon nitride. In the illustrated example, a thickness of the inner layer 351a may be about 10 Å; a thickness of the middle layer 351b may be about 10 Å; a thickness of the outer layer 351c may be about 120 Å. In the illustrated example, an interlayer dielectric layer 360 may further be formed to fill the gap between the first spacers 351 and the second spacer 352. The interlayer dielectric layer 360 may comprise oxide material such as HDP, TEOS, and TOZ.

Figure 3D:
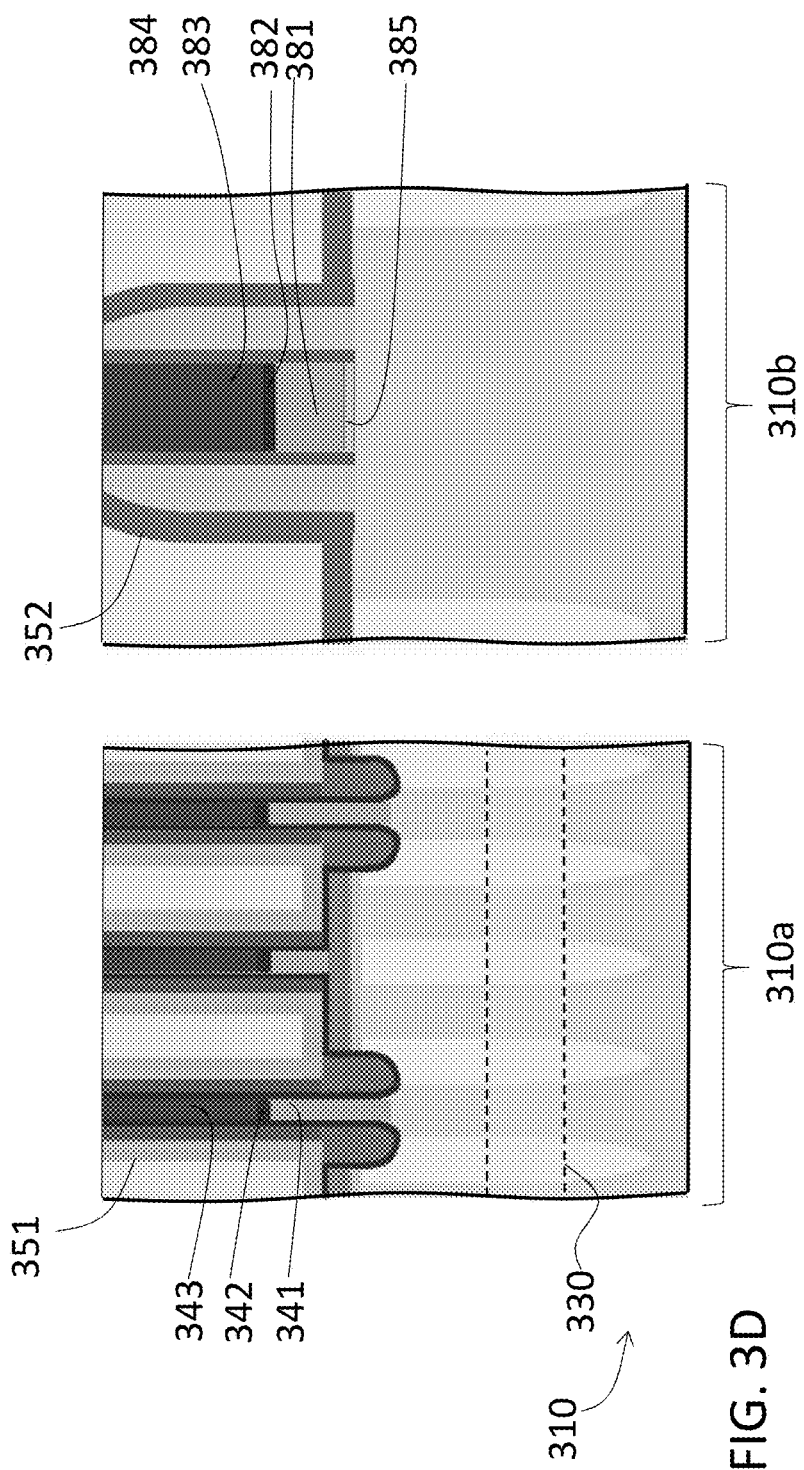

FIG. 3D illustrates a stage of an exemplary fabricating process of a semiconductor structure in accordance with some embodiments. Referring to FIG. 3D, mask patterns 344, 384 over the stack features 340, 380 are removed to expose the first dummy layer (i.e., first dummy portions 323, 383). For instance, a chemical mechanical polishing processes may be applied such that the mask patterns 344, 384, and top portions of the spacers 351, 352 lining the mask layer 324, 384 are removed.

Figure 3E:
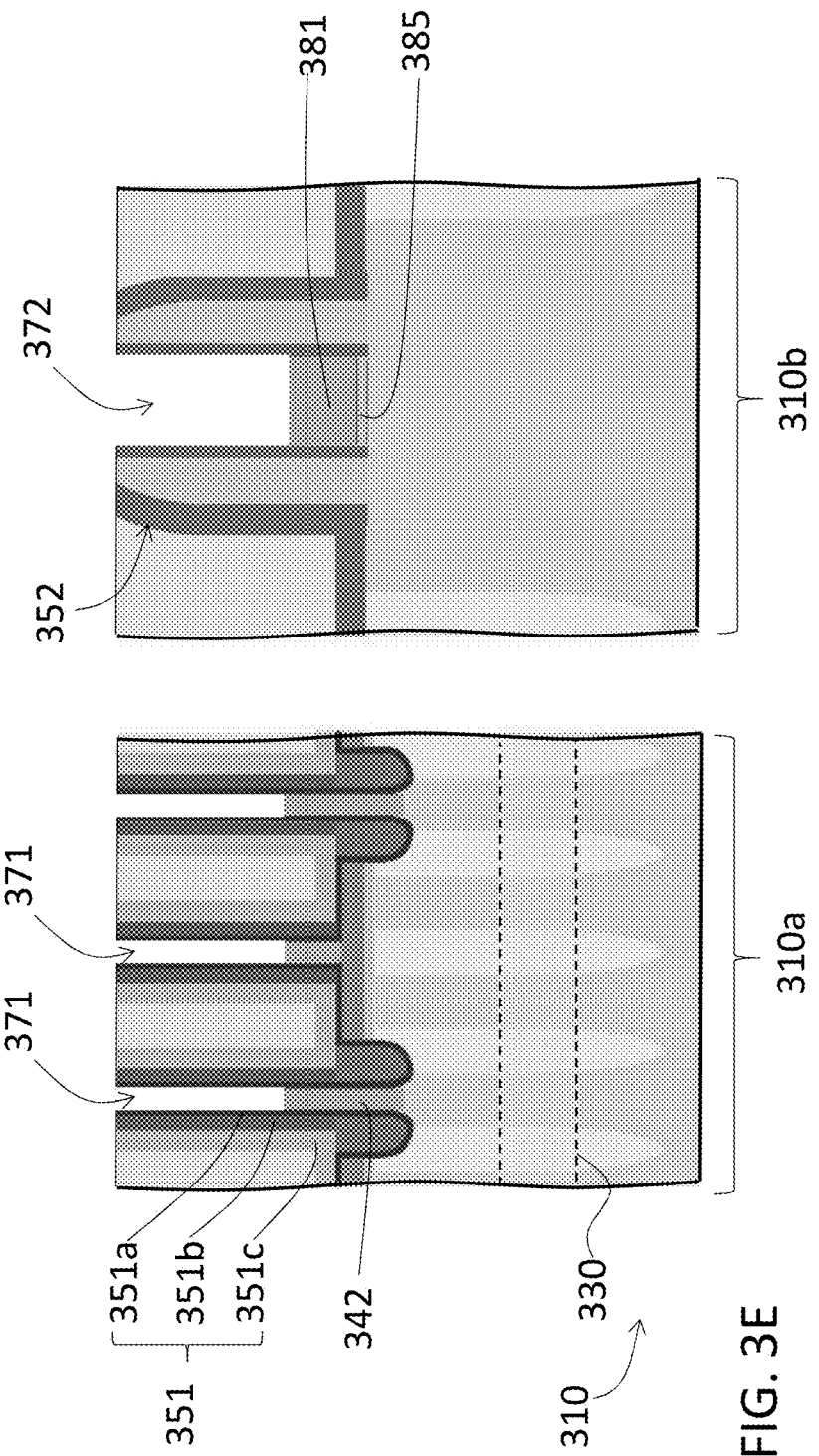

FIG. 3E illustrates a stage of an exemplary fabricating process of a semiconductor structure in accordance with some embodiments. Referring to FIG. 3E, the first dummy layer (i.e., first dummy portions 343, 383) and buffer layer (i.e., buffer portions 342, 382) of the stack features 340, 380 are recessed such that a plurality of first recess 371 and a second recess 372 are defined. In the illustrated embodiment, the first recess 371 is narrower than the second recess 372.

Figure 3F:
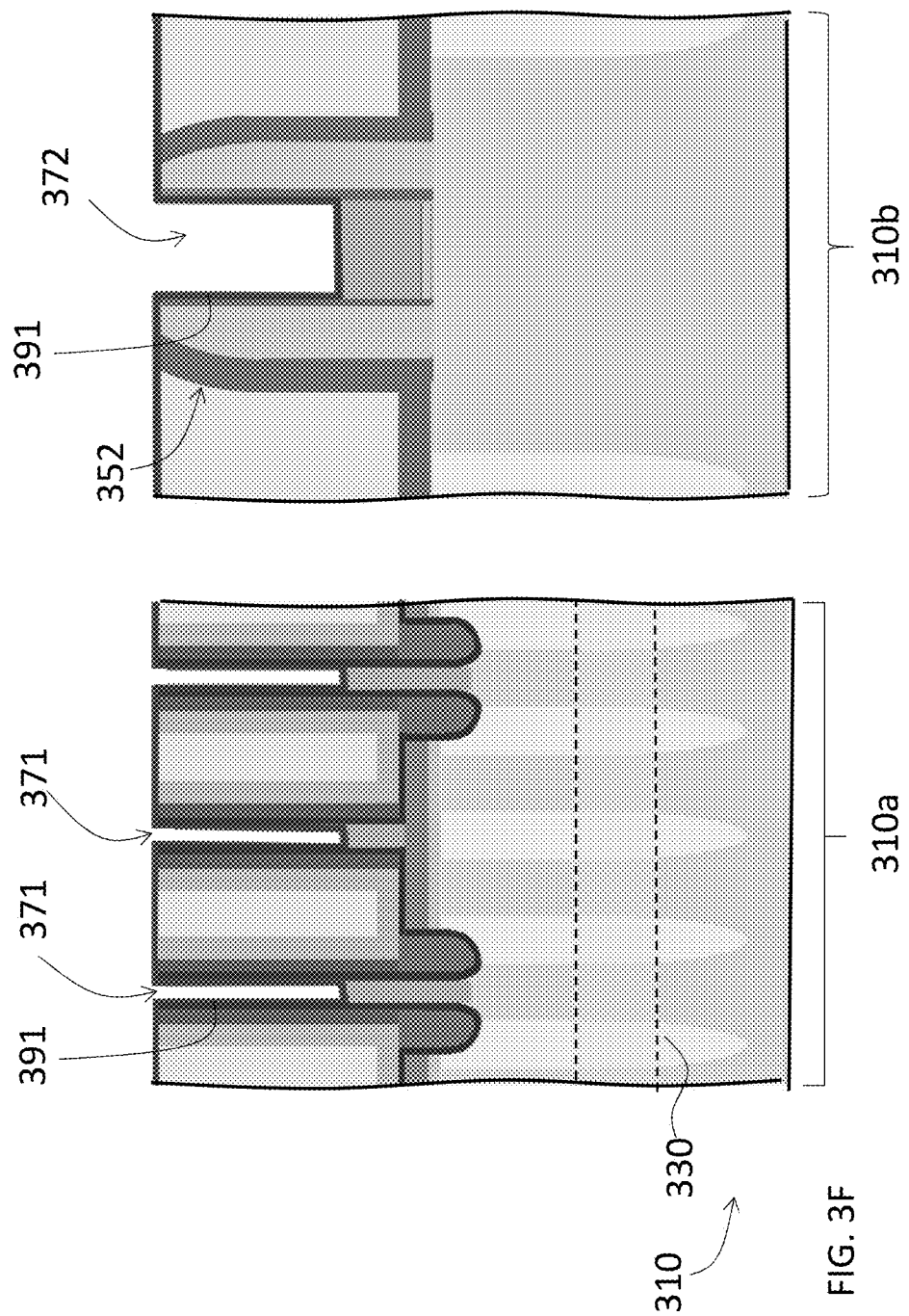

FIG. 3F illustrates a stage of an exemplary fabricating process of a semiconductor structure in accordance with some embodiments. Referring to FIG. 3F, a buffer liner 391 is conformally deposited and extends into each of the recesses 371, 372. In the illustrated embodiments, the buffer liner 391 in the respective recesses 371, 372 comprises one or more of material selected from, e.g., Ti, TiN, and TSN. The buffer liner 391 may be formed via performing a CVD deposition.

Figure 3G:
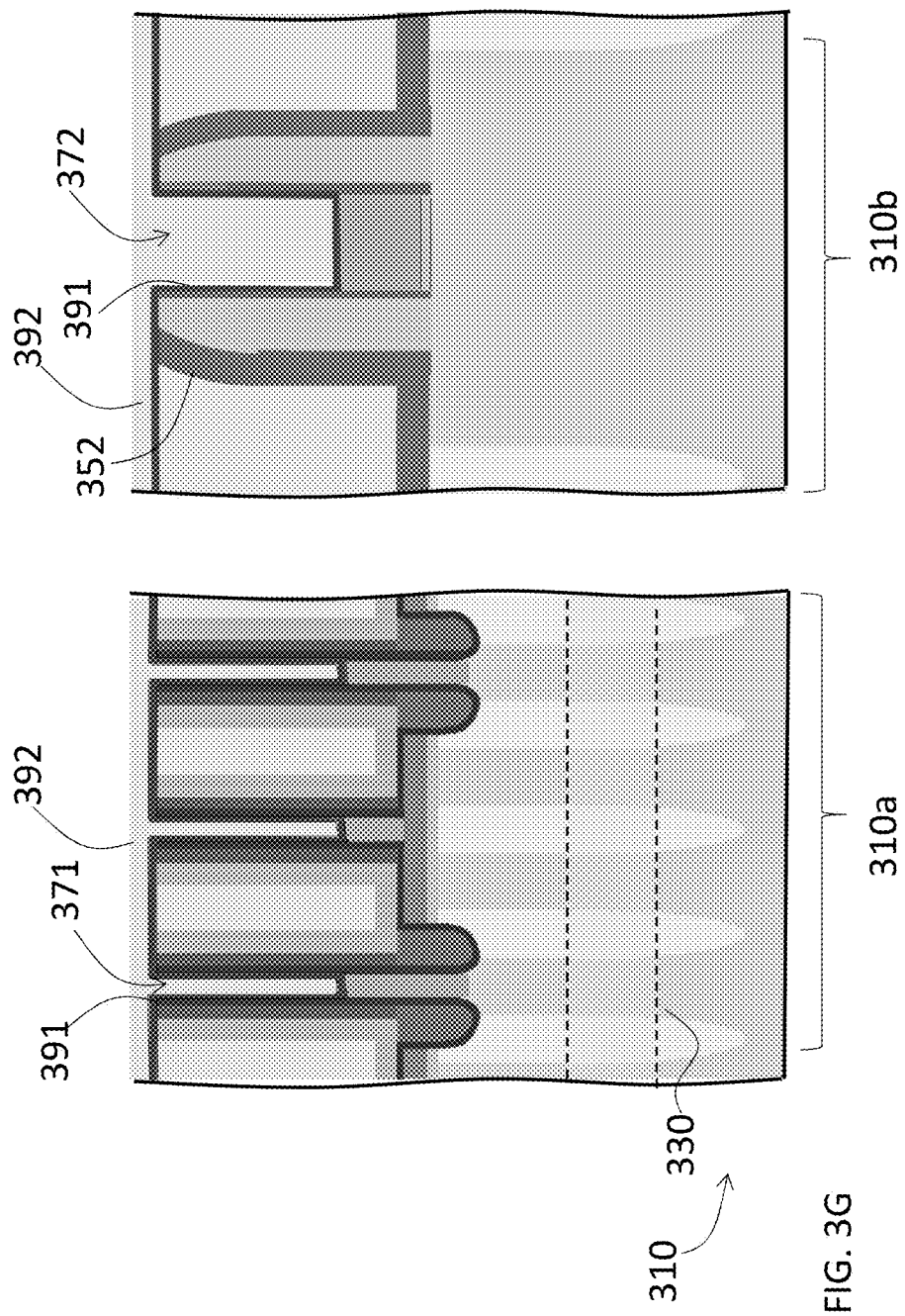

FIG. 3G illustrates a stage of an exemplary fabricating process of a semiconductor structure in accordance with some embodiments. Referring to FIG. 3G, a spin-on deposition process is performed to fill the respective recesses with a spin-on hard mask (SOH) material 392.

Figure 3H:
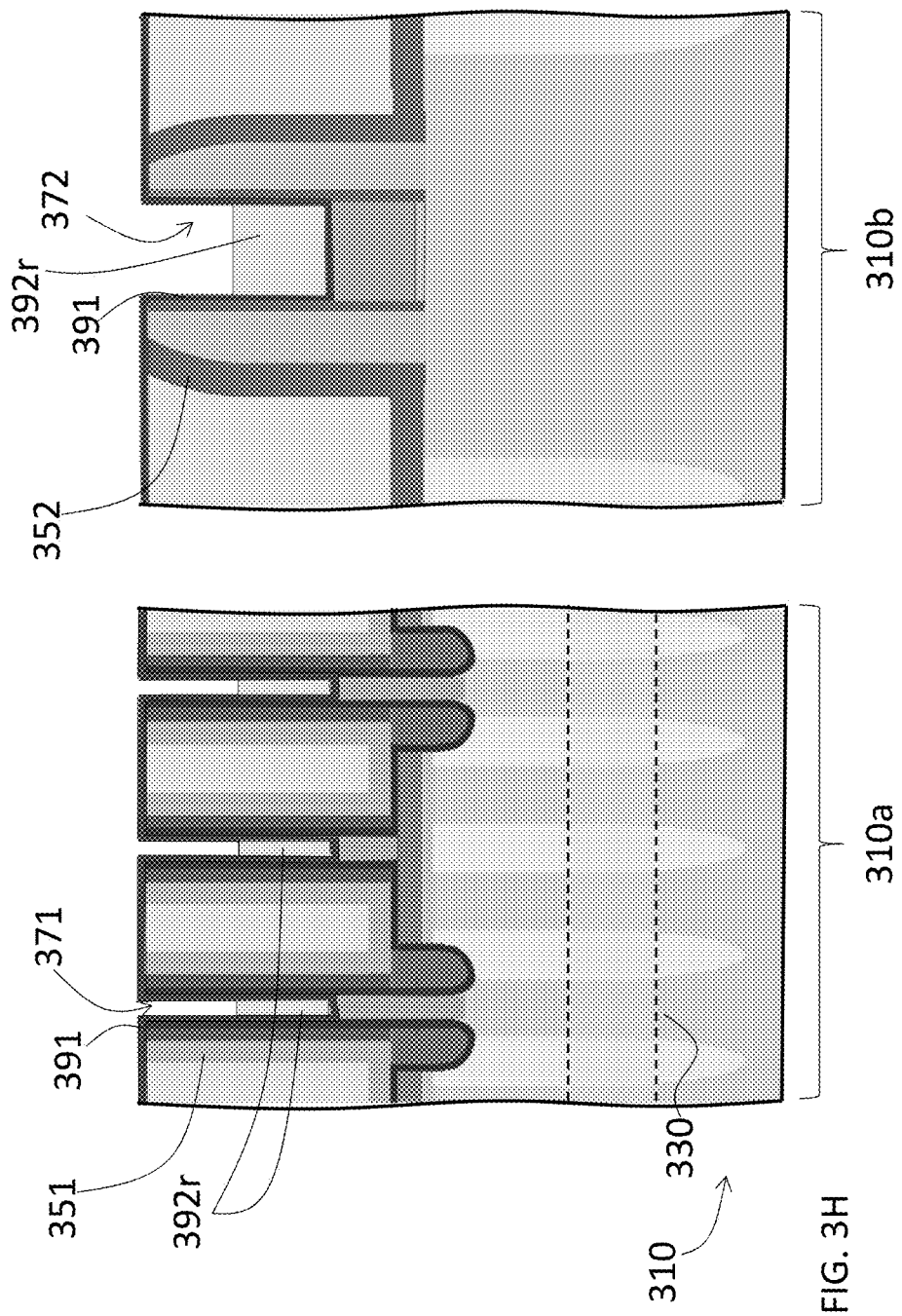

FIG. 3H illustrates a stage of an exemplary fabricating process of a semiconductor structure in accordance with some embodiments. Referring to FIG. 3H, the SOH material 392 is recessed such that top surfaces of remaining portions 392r of the SOH material becomes lower than that of the first spacer 351 and the second spacer 352. The remaining portions 392r (also referred as to second dummy layer 392r) of the SOH material are left on the buffer liner 391 in the first and the second recesses 371, 372, respectively. In the other words, top surface of the second dummy layer 392r reaches a level below that of the first and second spacers 351, 352. In some embodiments, the SOH material 392r has etching selectivity with respect to the buffer liner 391 in each of the recesses 371, 372.

Figure 3I:
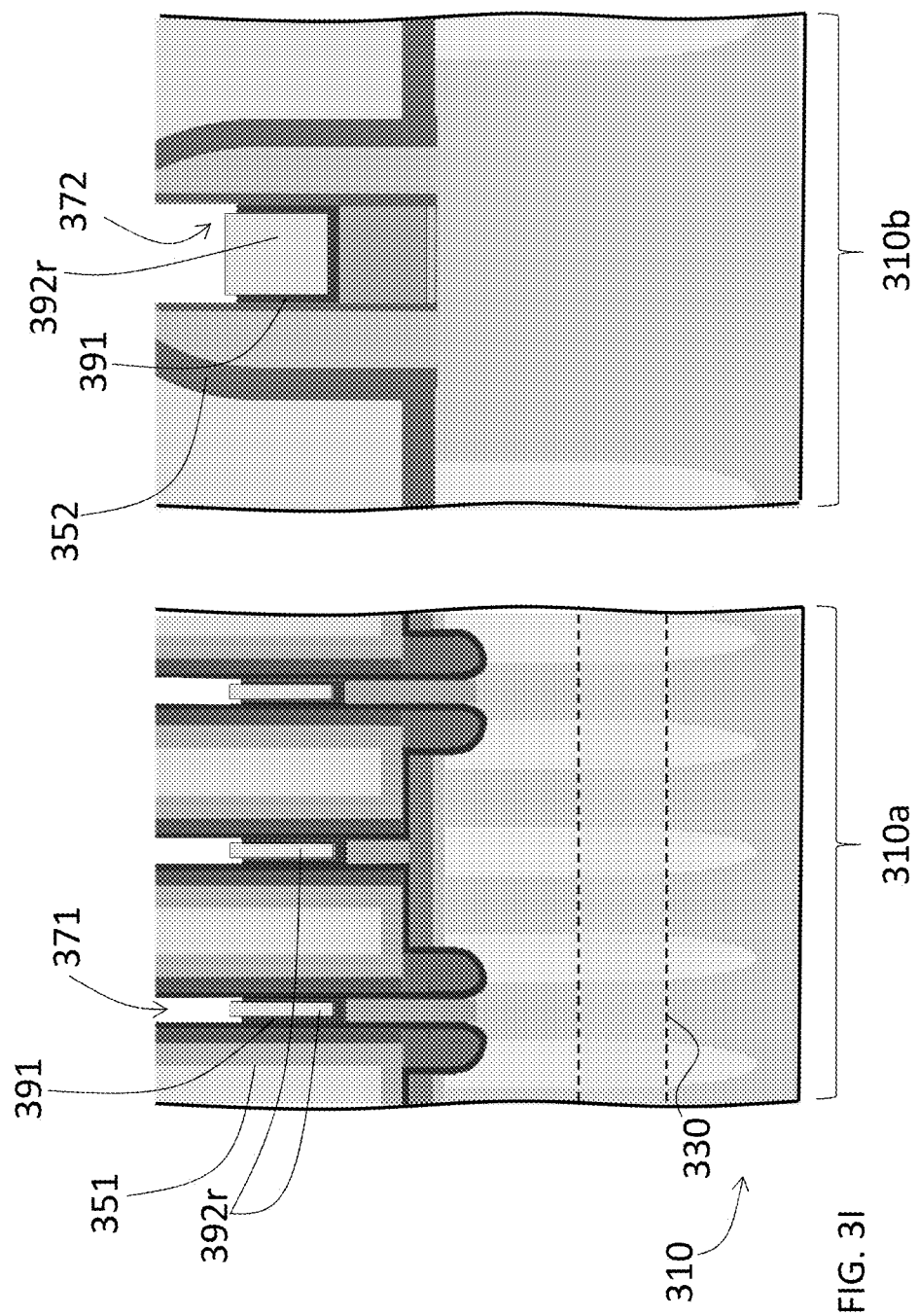

FIG. 3I illustrates a stage of an exemplary fabricating process of a semiconductor structure in accordance with some embodiments. Referring to FIG. 3I, the buffer liner 391 in the respective recesses 371, 372 is recessed. In the illustrated embodiment, buffer liner 391 in the respective recesses 371, 372 is recessed in a same process. Accordingly, the top edges of the buffer liner 391 in the respective recesses 371, 372 may be substantially at a same level.

In some embodiments, the recess of the buffer liner 391 may include performing a wet etching process utilizing etching solution such as Hydrogen Peroxide ($H_2O_2$). Due to the difference in etch selectivity between the second dummy layer 392r and the buffer liner 391, the recessed buffer liner 391 in the respective recesses 371, 372 may reach a height that is close to, but not the same as, that of the second dummy layer 392r. In some embodiments, the top edge of the recessed buffer liner 391 in the respective recesses 371, 372 is lower than top surface of the neighboring second dummy layer 392r.

Figure 3J:
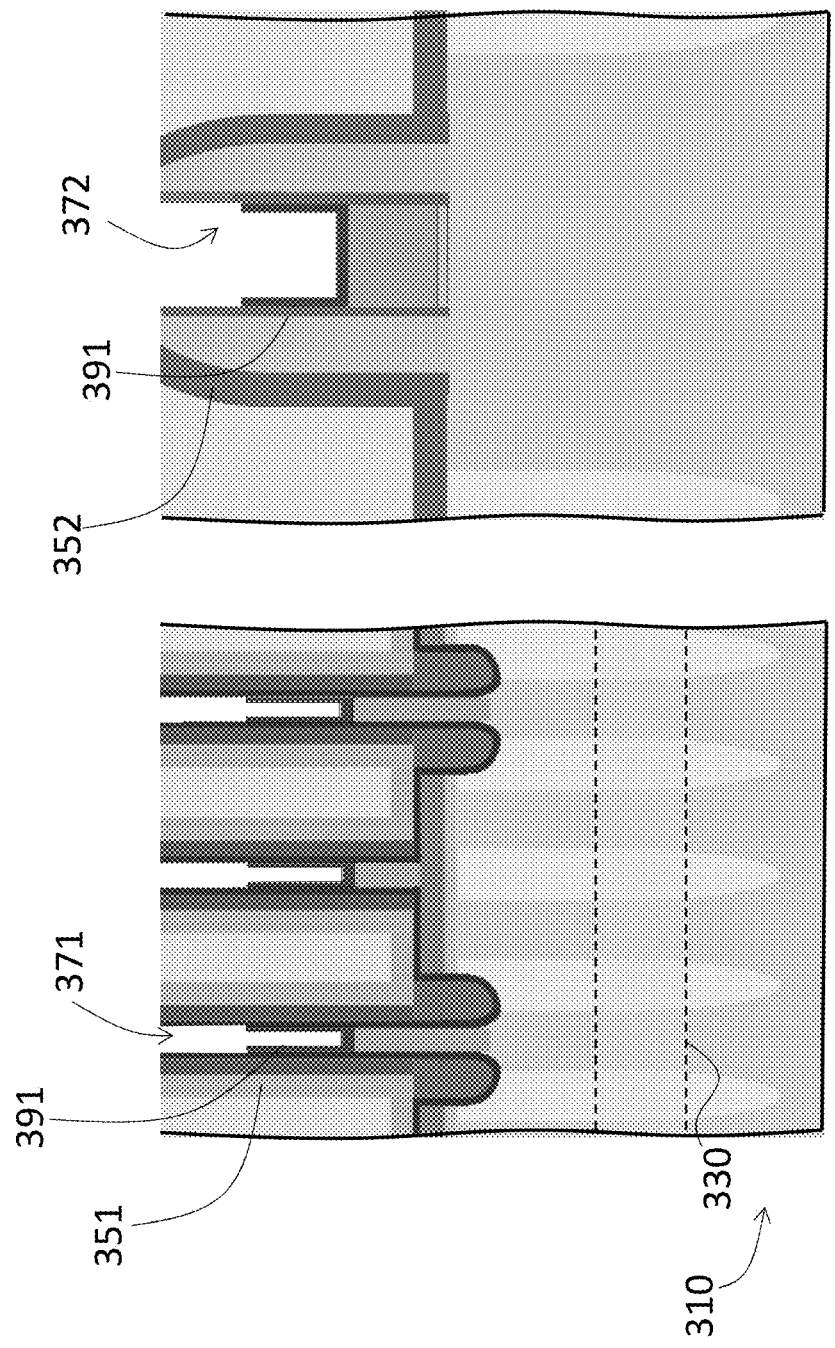

FIG. 3J illustrates a stage of an exemplary fabricating process of a semiconductor structure in accordance with some embodiments. Referring to FIG. 3J, the second dummy layer 392r is removed to expose the recessed buffer liner 391 from the respective recesses 371, 372. In some embodiments, the second dummy layer 392r may be removed via performing an ashing process.

Figure 3K:
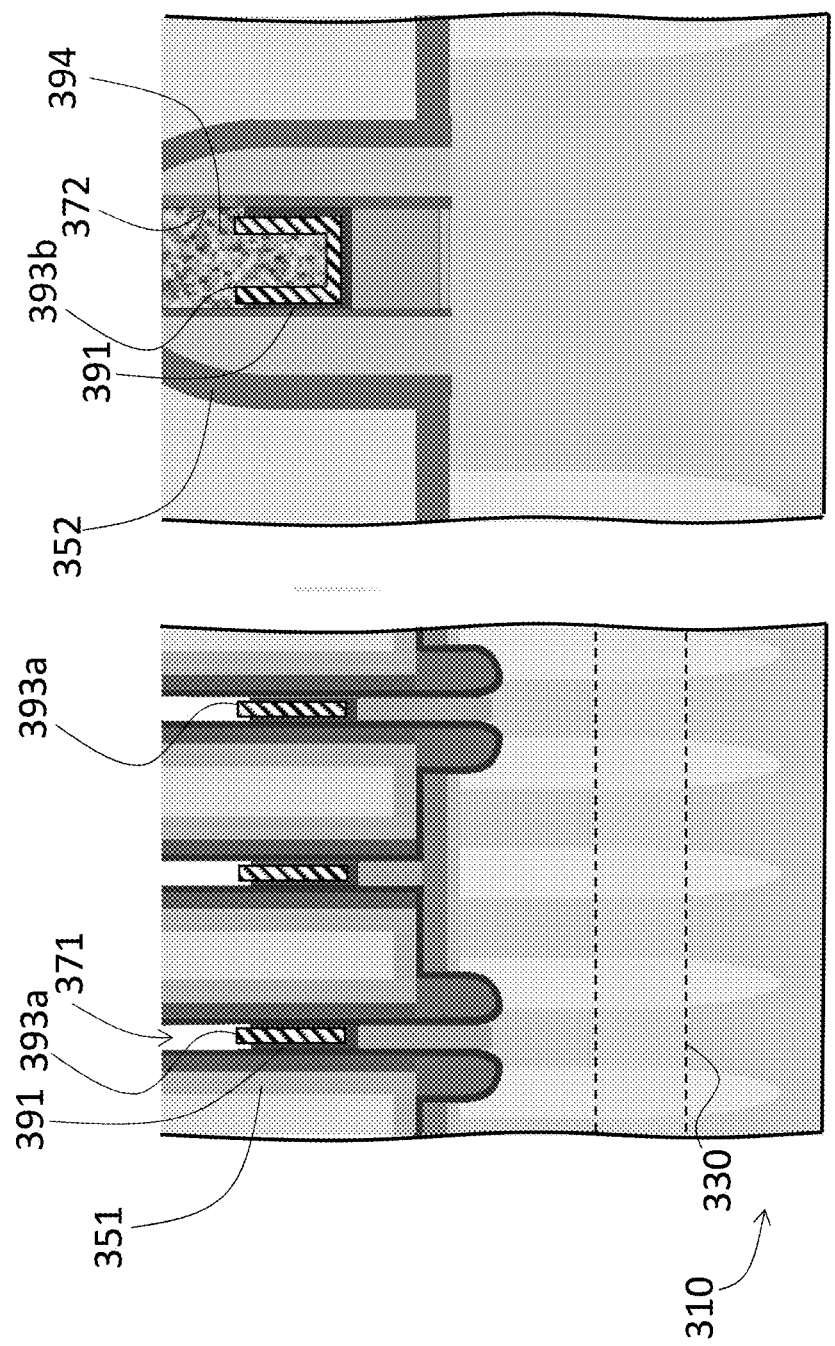

FIG. 3K illustrates a stage of an exemplary fabricating process of a semiconductor structure in accordance with some embodiments. Referring to FIG. 3K, metal material is deposited in the respective recesses 371, 372 to form a BL conductor 393a and a conductive liner 393b between the first spacer 351 and the second spacer 352, respectively.

Due to surface material characteristics, the metal material may deposit at a higher rate on the buffer liner 391 (a layer comprising Ti, TiN, TSN or a combination thereof) in the respective recesses 371, 372 than that on the spacers 351, 352 (a layer comprising silicon nitride, silicon oxide or a combination thereof). That is, the BL conductors 393a and the conductive liner 393b may be formed by a selective deposition process. In some embodiments, the BL conductors 393a and the conductive liner 393b may selectively comprise Ru and Co.

In some embodiments, the disposition of the BL conductors 393a and the conductive liner 393b may comprise cyclic ALD process and ALE process. During the ALD process, the metal material (e.g., Ru and/or Co) may be primarily deposited on the buffer liner 391. On the other hand, the ALE process allows the removal of individual atomic layers of the metal material that relatively slowly deposited on spacers 351, 352.

In the illustrated example, the BL conductor 393a has a top surface at a level higher than a top edge of the recessed buffer liner 391 in the recesses 371, 372. In some embodiments, top edges of the recessed buffer liner 391 in the recess 371 and 372 may be covered by the BL conductor 393a and the conductive liner 393b, respectively.

In the illustrated embodiments, the conductive liner 393b and the BL conductor 393a may be formed in a same process. As such, the BL conductor 393a may have a top surface substantially at the same level as that of the conductive liner 393b. In addition, the conductive liner 393b may include an identical material as that of the BL conductor 393a.

As discussed before, the BL conductor 393a may be formed to have a narrower lateral width than a tungsten BL conductor without a need for an increased thickness $H_{31}$ (which is one of the causes that leads to the leaning problem). For example, an area of the cross section of the BL conductor 393a may be in a range from about 75 to 1750 $nm^2$. In such embodiments, a width of the BL conductor 393a made of Ru can be designed to be in a range from about 5 to 25 nm. In the illustrated embodiment, a thickness $H_{31}$ of the BL conductor 393a is in a range from 15 to 70 nm.

In some embodiments, a thickness variation between BL conductors 393a is in a range from about 1 to 5%. The processes for recessing the SOH materials 392 to form the remaining portions 392r (illustrated in FIG. 3H) and the process for selective deposition of BL conductors 393a may together contribute to the thickness variation between BL conductors 393a. However, the incorporation of low resistance materials such as Ru and Co in the word line structure substantially offsets the thickness variation among the BL conductors 393a.

Figure 3L:
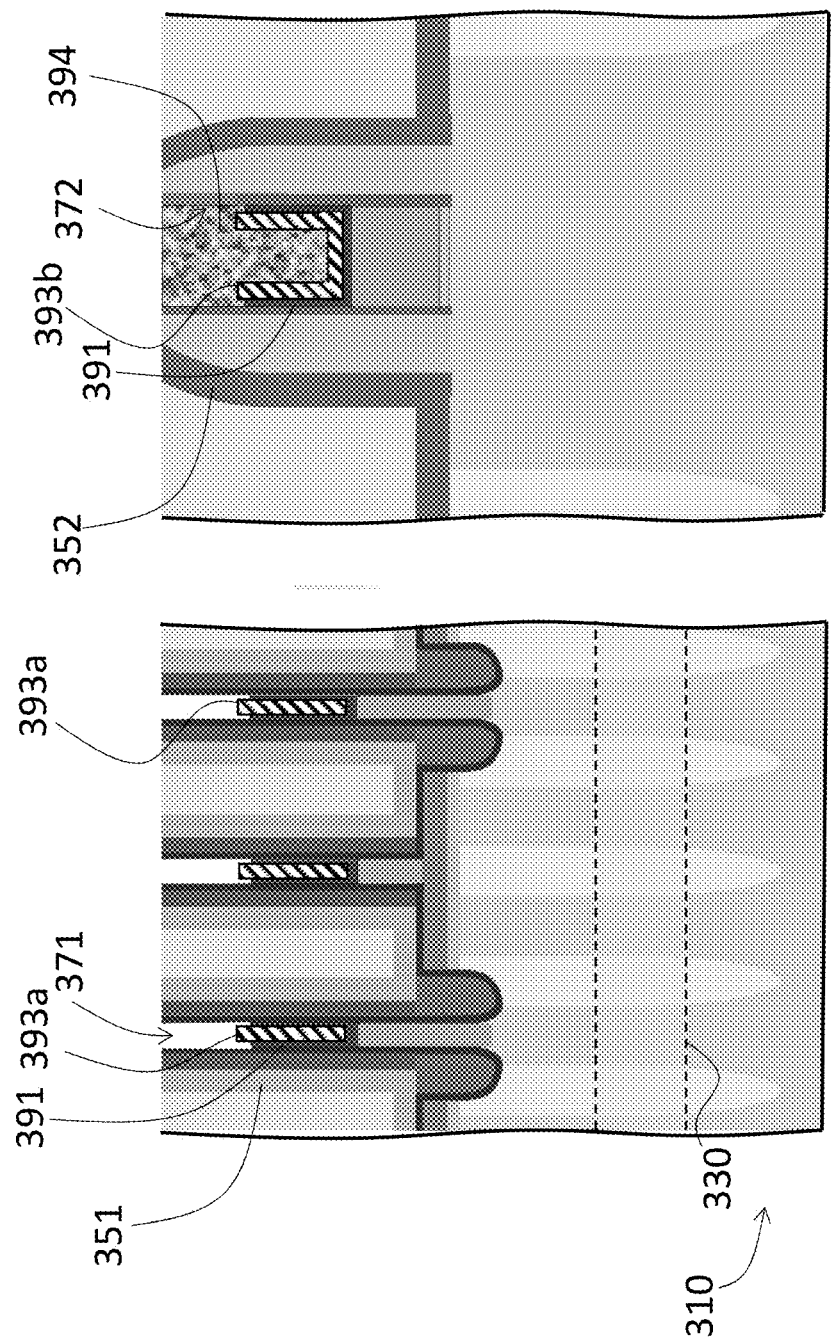

Referring to FIG. 3L, a gate conductor 394 is disposed on the conductive liner 393b in the second recess 372. In some embodiments, the gate conductor 394 may comprise tungsten.

Figure 3M:
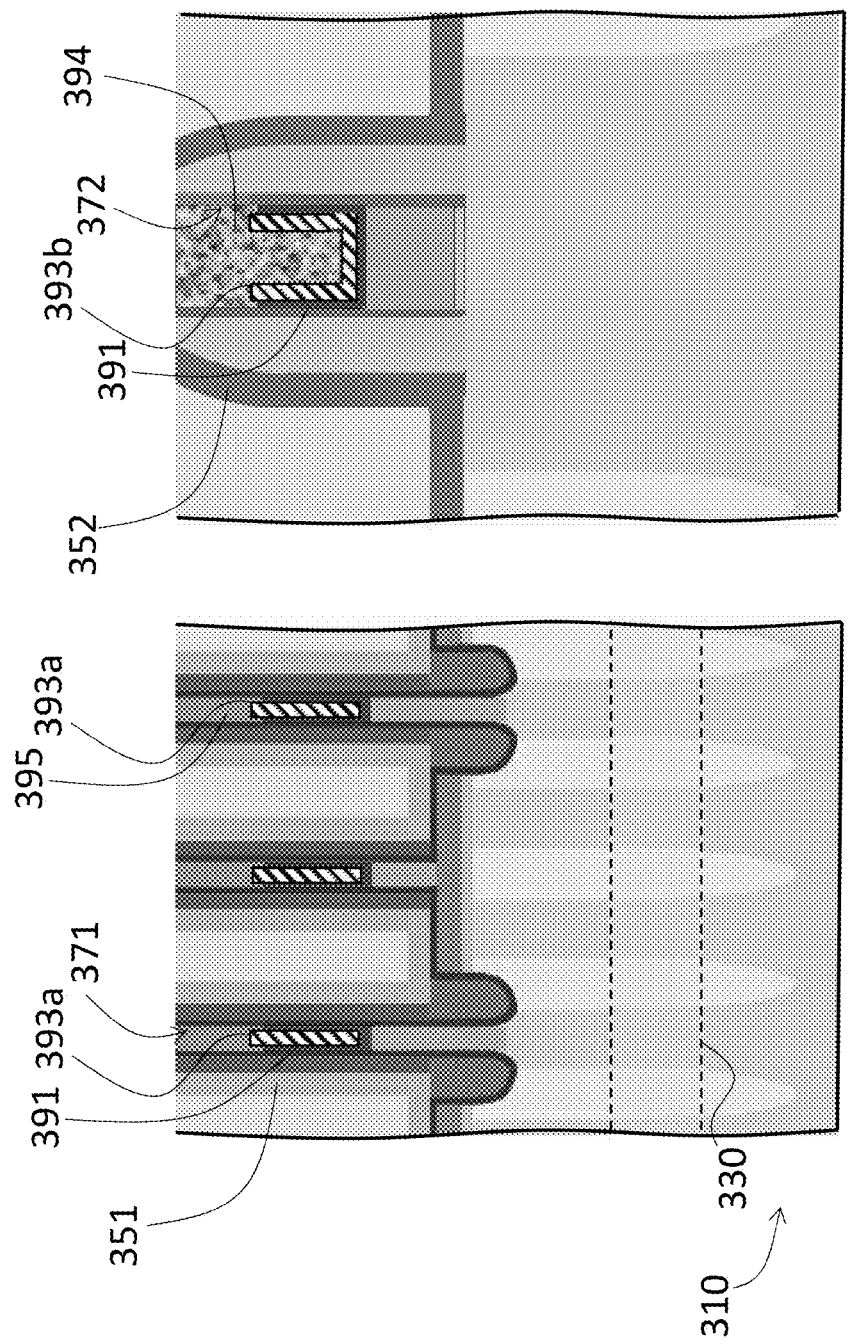

Referring to FIG. 3M, which shows that cap layers 395 are formed to cover the BL conductors 393a. The cap layers 395 may comprise silicon nitride. The formation of the cap layers may comprise filling material having silicon nitride in the first recess 371 and etching back the material within the cell region 310a.

In some embodiments, the portions of the interlayer 360 between the first spacers 351 may be further replaced by a conductive material such as polysilicon that establishes vertical electronical path between a landing pad thereon and an active region there-under.

One aspect of the instant disclosure provides a semiconductor structure, which comprises a substrate, a bit line (BL) stack feature and a BL spacer. The substrate has a cell area and a periphery area defined thereon. The bit line stack feature formed over an active region in the cell area, comprises a buffer liner having a U-shaped profile that opens upwardly in a cross section thereof and defining an inner surface, a BL conductor disposed in the U-shaped profile on the inner surface, and a capping layer over the BL conductor. The BL spacer covers sidewall surfaces of the BL stack feature.

In some embodiments of the instant disclosure, the semiconductor structure further comprises a gate stack feature over the periphery area and a gate spacer covering sidewall surfaces of the gate stack feature. The gate stack feature comprises a gate dielectric on the substrate, a buffer liner over the gate dielectric having a U-shaped profile opened upwardly in a cross section thereof and defining an inner surface, a conductive liner disposed in the U-shaped profile on the inner surface of the buffer liner, and a gate conductor formed on the conductive liner. Wherein a height of the buffer liner of the gate stack feature is substantially equal to a height of the buffer liner of the bit line stack.

In some embodiments of the instant disclosure, wherein the BL conductor selectively comprises Ru and Co.

In some embodiments of the instant disclosure, a thickness of the BL conductor is in a range from about 15 to 70 nm.

In some embodiments of the instant disclosure, wherein an area of the cross section of the BL conductor is in a range from about 75 to 1750 $nm^2$.

In some embodiments of the instant disclosure, a thickness of the buffer liner (232) of the BL stack feature is about 10 Å.

In some embodiments of the instant disclosure, the BL conductor has a top surface substantially at the same level as that of the conductive liner of the gate stack feature.

In some embodiments of the instant disclosure, the BL conductor includes identical material as that of the conductive liner of the gate stack feature.

In some embodiments of the instant disclosure, the buffer liner of the gate stack feature includes identical material as that of the buffer liner of the BL stack feature.

In some embodiments of the instant disclosure, the buffer liner of the BL stack feature selectively comprises TiN and TSN.

In some embodiments of the instant disclosure, wherein the BL conductor has a top surface at a level higher than a top edge of the buffer liner of the bit line stack feature.

One aspect of the instant disclosure provides a method.

In some embodiments of the instant disclosure, comprises forming a layer stack over a substrate that has a cell area and a periphery area defined thereon, the layer stack comprises a first dummy layer at an upper portion thereof; patterning the layer stack to form a first stack feature over the cell area and a second stack feature over the periphery area, wherein the first stack feature is narrower than the second stack feature; forming a first spacer covering sidewall surfaces of the first stack feature, and forming a second spacer covering sidewall surfaces of second stack feature; removing the first dummy layer of the first stack feature and the second stack feature to respectively define a first and a second recess between the first spacer and the second spacer, wherein the first recess is narrower than the second recess; depositing a buffer liner in each of the recesses; forming second dummy layer on the buffer liner respectively in the first and the second recesses with top surface thereof at a lower level than that of the first and second spacers, wherein the second dummy layer has an etching selectivity with respect to the buffer liner in each of the recesses; recessing the buffer liner in the respective recesses such that the buffer liner in the respective recesses reaches a height substantially equal to that of the second dummy layer; removing the second dummy layer to expose the recessed buffer liner in the respective recesses; selectively depositing metal material in the respective recesses to form a BL conductor between the first spacer and a conductive liner between the second spacer; and depositing a gate conductor on the conductive liner in the second recess.

In some embodiments of the instant disclosure, wherein the forming of second dummy layer respectively in the first and the second recesses includes: performing a spin-on deposition to fill the respective recesses with a spin-on hard mask (SOH) material; and recessing the SOH material such that top surface of remaining portion of the SOH material is lower than that of the first spacer and the second spacer.

In some embodiments of the instant disclosure, the metal material selectively comprises Ru and Co.

In some embodiments of the instant disclosure, a thickness of the BL conductor is in a range from 15 to 70 nm.

In some embodiments of the instant disclosure, wherein an area of the cross section of the BL conductor is in a range from about 75 to 1750 nm$^2$.

In some embodiments of the instant disclosure, the buffer liner in the respective recesses selectively comprises TiN and TSN.

In some embodiments of the instant disclosure, the forming the stack comprises: forming a conductive layer over the substrate; forming a buffer layer on the conductive layer; and forming the first dummy layer on the buffer layer.

One aspect of instant disclosure provides a method comprising forming a layer stack over a substrate, the layer stack comprises a first dummy layer at an upper portion thereof; patterning the layer stack to form a stack feature; forming a spacer covering sidewall surfaces of the stack feature; removing the first dummy layer of the stack feature to define a recess between the spacer; depositing a buffer liner in the recess; forming a second dummy layer on the buffer liner with top surface thereof at a level lower than that of the spacer, wherein the second dummy layer has etching selectivity with respect to the buffer liner; recessing the buffer liner such that the buffer liner reaches a height substantially equal to that of the second dummy layer; removing the second dummy layer to expose the buffer liner; selectively depositing metal material in the recess to form a bit line (BL) conductor having a thickness between the spacer; and forming a cap layer covering the BL conductor.

In some embodiments of the instant disclosure, the forming the second dummy layer includes performing a spin-on deposition to fill the respective recesses with a spin-on hard mask (SOH) material; and recessing the SOH material such that top surface of remain portion of the SOH material is lower than that of the spacer.

The embodiments shown and described above are only examples. Many details are often found in the art such as the other features of a radiation measurement panel and device. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A semiconductor structure, comprising:
 a substrate having a cell area and a periphery area defined thereon;
 a bit line stack feature over an active region in the cell area, the BL stack feature comprising
  a buffer liner having a U-shaped profile that opens upwardly in a cross section thereof and defining an inner surface,
  a BL conductor disposed in the U-shaped profile on the inner surface, and
  a capping layer over the BL conductor; and
 a BL spacer covering sidewall surfaces of the BL stack feature.

2. The semiconductor structure of claim 1, further comprises
 a gate stack feature over the periphery area, the gate stack feature comprising
  a gate dielectric on the substrate,
  a buffer liner over the gate dielectric having a U-shaped profile opened upwardly in a cross section thereof and defining an inner surface,
  a conductive liner disposed in the U-shaped profile on the inner surface of the buffer liner, and
  a gate conductor formed on the conductive liner; and
 a gate spacer covering sidewall surfaces of the gate stack feature;
 wherein a height of the buffer liner of the gate stack feature is substantially equal to a height of the buffer liner of the bit line stack.

3. The semiconductor structure of claim 2,
 wherein the BL conductor selectively comprises Ru and Co.

4. The semiconductor structure of claim 3,
 wherein a thickness of the BL conductor is in a range from about 15 to 70 nm.

5. The semiconductor structure of claim 4,
 wherein an area of the cross section of the BL conductor is in a range from about 75 to 1750 nm$^2$.

6. The semiconductor structure of claim 1, wherein a thickness of the buffer liner of the BL stack feature is about 10 Å.

7. The semiconductor structure of claim 2, wherein the BL conductor has a top surface substantially at the same level as that of the conductive liner of the gate stack feature.

8. The semiconductor structure of claim 3, wherein the BL conductor includes identical material as that of the conductive liner of the gate stack feature.

9. The semiconductor structure of claim 2, wherein the buffer liner of the gate stack feature includes identical material as that of the buffer liner of the BL stack feature.

10. The semiconductor structure of claim 9, wherein the buffer liner of the BL stack feature selectively comprises TiN and TSN.

11. The semiconductor structure of claim 1, wherein the BL conductor has a top surface at a level higher than a top edge of the buffer liner of the BL stack feature.

* * * * *